United States Patent
Uchino et al.

(10) Patent No.: US 10,416,236 B2
(45) Date of Patent: Sep. 17, 2019

(54) DEGRADATION STATE ESTIMATING DEVICE, STATE-OF-CHARGE ESTIMATING DEVICE, OCV CURVE CALCULATING/GENERATING DEVICE, AND POWER STORAGE DEVICE

(71) Applicant: Murata Manufacturing Co., Ltd., Kyoto (JP)

(72) Inventors: Manabu Uchino, Kanagawa (JP); Narumi Arai, Kanagawa (JP)

(73) Assignee: MURATA MANUFACTURING CO., LTD, Kyoto (JP)

( * ) Notice: Subject to any disclaimer, the term of this patent is extended or adjusted under 35 U.S.C. 154(b) by 328 days.

(21) Appl. No.: 15/312,779

(22) PCT Filed: Mar. 18, 2015

(86) PCT No.: PCT/JP2015/001493
§ 371 (c)(1),
(2) Date: Nov. 21, 2016

(87) PCT Pub. No.: WO2015/186283
PCT Pub. Date: Dec. 10, 2015

(65) Prior Publication Data
US 2017/0146609 A1    May 25, 2017

(30) Foreign Application Priority Data
Jun. 4, 2014  (JP) .................. 2014-115353

(51) Int. Cl.
*G01R 31/367*  (2019.01)
*G01R 31/392*  (2019.01)
(Continued)

(52) U.S. Cl.
CPC ......... *G01R 31/367* (2019.01); *G01R 31/392* (2019.01); *H01M 10/4285* (2013.01);
(Continued)

(58) Field of Classification Search
CPC .... G01R 31/367; G01R 31/392; G01R 31/36; H01M 10/4285; H01M 10/486; H01M 10/48
(Continued)

(56) References Cited

U.S. PATENT DOCUMENTS 5,977,750 A * 11/1999 Ng .................. G01R 19/16542
320/132
2013/0110428 A1* 5/2013 Sun .................... G01R 31/3835
702/63

(Continued)

FOREIGN PATENT DOCUMENTS

JP   2003-329744 A   11/2003
JP   2009-080093 A    4/2009
(Continued)

OTHER PUBLICATIONS

Office Action for KR Patent Application No. 10-2016-7032322, dated Jun. 25, 2019, 06 pages of Office Action and 06 pages of English Translation.

*Primary Examiner* — Jeff W Natalini
(74) *Attorney, Agent, or Firm* — Chip Law Group

(57) ABSTRACT

A degradation state estimating device includes: a Q calculator that receives inputs of the voltage, the current, and the battery temperature of a secondary battery, and calculates a discharge capacity; an OCV calculator that calculates an open-circuit voltage (OCV) value; and an OCV curve estimator that estimates at least one OCV curve. A state-of-charge estimating device includes an SOC estimator that estimates a state of charge (SOC) from the OCV curve and the open-circuit voltage (OCV) value estimated by the degradation state estimating device.

10 Claims, 15 Drawing Sheets

(51) Int. Cl.
*H01M 10/48* (2006.01)
*H01M 10/42* (2006.01)
*G01R 31/3842* (2019.01)

(52) U.S. Cl.
CPC ......... *H01M 10/48* (2013.01); *H01M 10/486* (2013.01); *G01R 31/3842* (2019.01)

(58) Field of Classification Search
USPC .................................................. 324/426–437
See application file for complete search history.

(56) References Cited

U.S. PATENT DOCUMENTS

| | | | |
|---|---|---|---|
| 2013/0187657 A1* | 7/2013 | Yen | G01R 31/3842 324/427 |
| 2014/0084939 A1* | 3/2014 | Sejima | G01R 31/392 324/537 |
| 2016/0195585 A1* | 7/2016 | Wu | H01M 10/48 324/430 |

FOREIGN PATENT DOCUMENTS

| | | |
|---|---|---|
| JP | 2013-158087 A | 8/2013 |
| JP | 2014-010003 A | 1/2014 |

* cited by examiner

FIG. 3
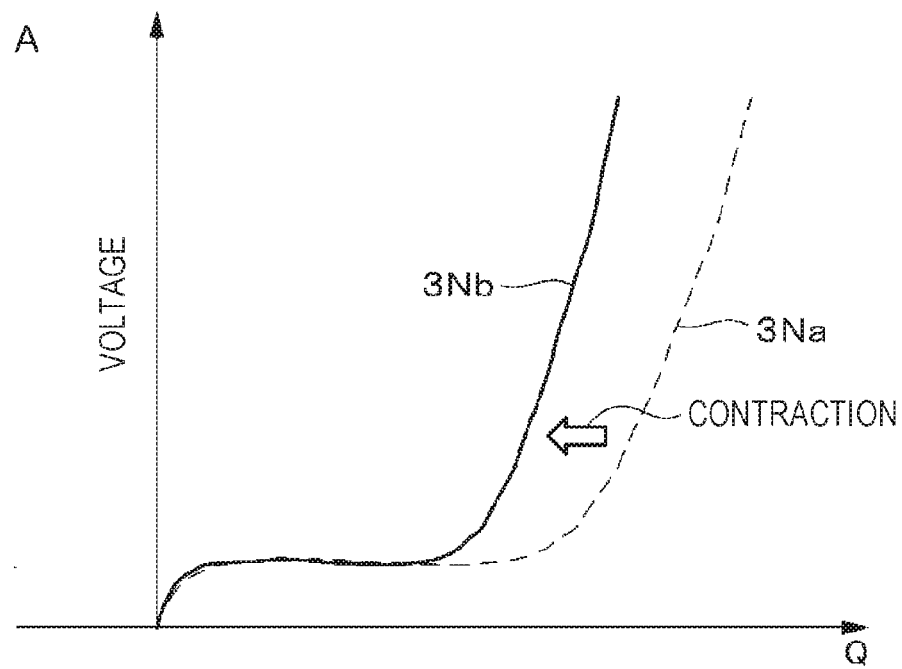
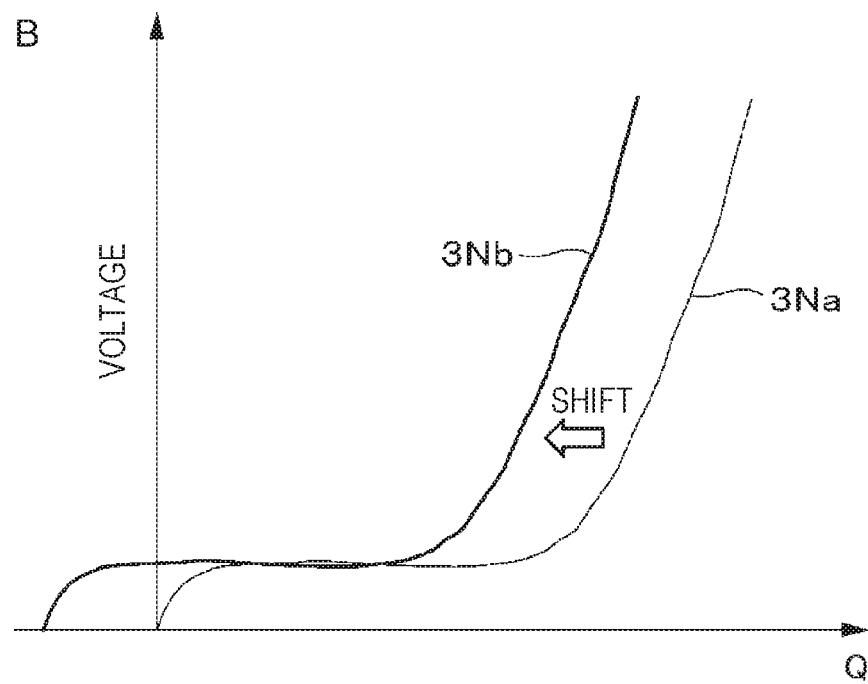

FIG. 4
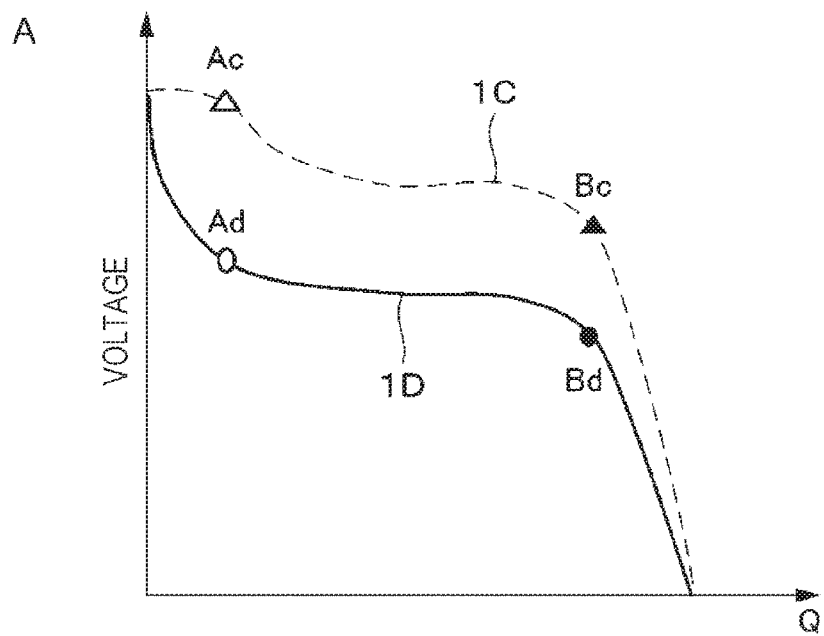
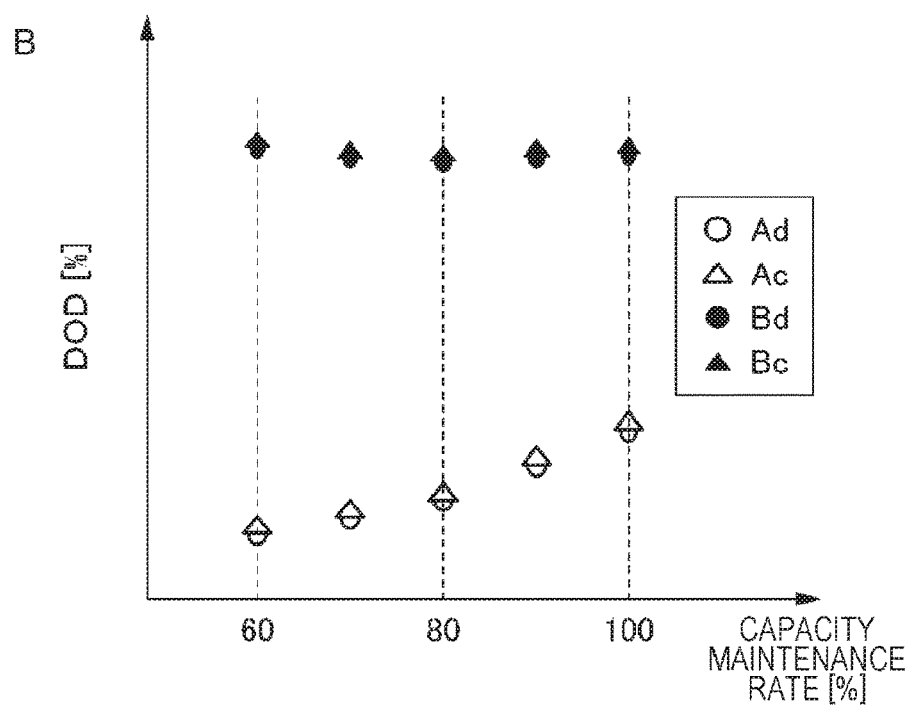

133

ESTIMATED OCV VALUE RECORDING MEMORY

| DISCHARGE-SIDE Q [mAh] | DISCHARGE-SIDE OCV [V] | CHARGE-SIDE Q [mAh] | CHARGE-SIDE OCV [V] |
|---|---|---|---|
| 0 | 3.40 | 0 | 3.40 |
| 100 | 3.35 | 100 | 3.38 |
| 200 | 3.32 | 200 | 3.36 |
| ... | ... | ... | ... |

FIG. 11
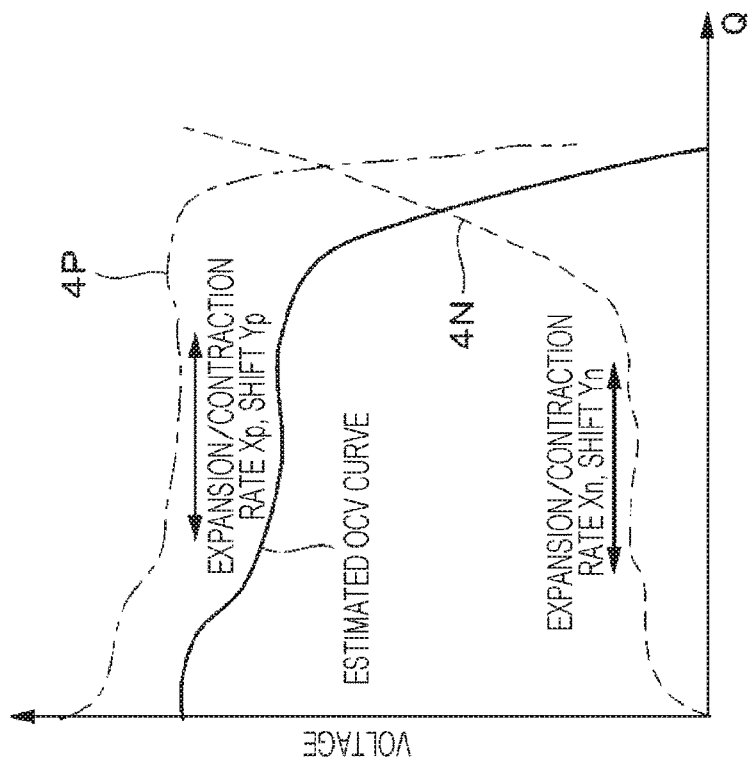
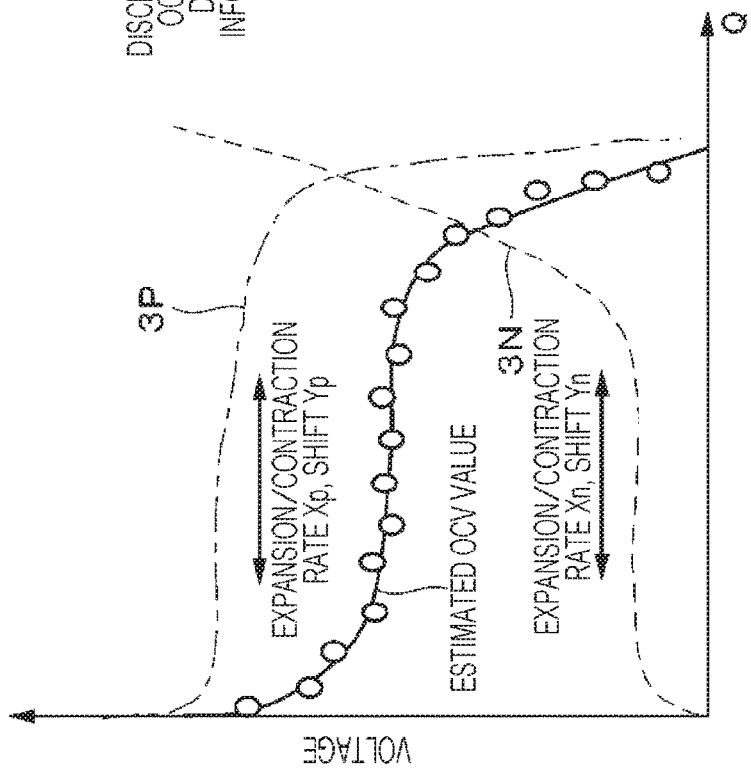

FIG. 17

CORRELATION TABLE

| DISCHARGE-SIDE OCV [V] | CHARGE-SIDE OCV [V] |
|---|---|
| 3.40 | 3.40 |
| 3.35 | 3.38 |
| 3.32 | 3.36 |
| ... | ... |
| 2.10 | 2.30 |
| 2.00 | 2.00 |

OCV-Q DATA TABLE

| DISCHARGE CAPACITY Q [mAh] | DISCHARGE-SIDE OCV [V] | CHARGE-SIDE OCV [V] |
|---|---|---|
| 0 | 3.40 | UNKNOWN |
| 100 | 3.35 | UNKNOWN |
| 200 | 3.32 | UNKNOWN |
| ... | ... | ... |
| 2900 | 2.10 | UNKNOWN |
| 3000 | 2.00 | UNKNOWN |

TABLE REFERENCE ⇒ CHARGE-SIDE OCV IS CALCULATED

OCV-Q DATA TABLE

| DISCHARGE CAPACITY Q [mAh] | DISCHARGE-SIDE OCV [V] | CHARGE-SIDE OCV [V] |
|---|---|---|
| 0 | 3.40 | 3.40 |
| 100 | 3.35 | 3.38 |
| 200 | 3.32 | 3.36 |
| ... | ... | ... |
| 2900 | 2.10 | 2.30 |
| 3000 | 2.00 | 2.00 |

DEGRADATION STATE ESTIMATING DEVICE, STATE-OF-CHARGE ESTIMATING DEVICE, OCV CURVE CALCULATING/GENERATING DEVICE, AND POWER STORAGE DEVICE

CROSS REFERENCE TO RELATED APPLICATIONS

This application is a U.S. National Phase of International Patent Application No. PCT/JP2015/001493 filed on Mar. 18, 2015, which claims priority benefit of Japanese Patent Application No. JP 2014-115353 filed in the Japan Patent Office on Jun. 4, 2014. The above-referenced applications is hereby incorporated herein by reference in its entirety.

TECHNICAL FIELD

The present disclosure relates to a device that estimates a degradation state of a secondary battery, a state-of-charge estimating device, an OCV curve calculating/generating device, and a power storage device.

BACKGROUND ART

Secondary batteries, such as lithium-ion batteries or nickel-metal-hydride batteries, are widely used as power sources in mobile terminal devices that are typically mobile phones. In the recent increasing trend of protection of the environment, attention is being paid to renewable energies, such as solar power and wind power, and secondary batteries are becoming popular and being widely used to store the energies. As for automobiles, hybrid vehicles and electric vehicles that carry secondary batteries are becoming popular. In this manner, secondary batteries serve as key devices essential in power usage.

In such circumstances, accurately sensing the remaining capacity (also referred to as the state of charge (SOC), as appropriate) of a secondary battery is critical in responding to the trust the user has for the product. If the accuracy of sensing SOC is poor in a power storage device for emergencies (such as a power failure), for example, the power is unexpectedly cut off, and a power failure occurs in the power storage device, even though the display indicates a sufficient remaining capacity. In the case of a vehicle, for example, even when the display indicates a sufficient remaining capacity, the vehicle might unexpectedly stop, and fail to reach its destination.

According to a typical method of estimating SOC, open-circuit voltage (OCV) is first estimated, and SOC is estimated from the relationship between OCV and SOC specified beforehand in a table or the like. There is a known method of estimating OCV while updating the parameters of an equivalent circuit model with an adaptive filter or a Kalman filter. Meanwhile, as for the relationship between OCV and SOC (this relationship is also called an OCV curve, as it draws a curved line), it is known that the types of the positive and negative electrodes vary primarily with battery configurations. As the battery degrades, the shape of the OCV curve changes. Accordingly, the SOC estimation accuracy depends on how accurately the OCV curve is calculated.

It is known that an OCV curve has hysteresis characteristics. That is, different OCV curves are obtained when discharge is larger (the proportion of discharge is larger than the proportion of charge) and when charge is larger (the proportion of charge is larger than the proportion of discharge). Therefore, it is necessary to hold two OCV curves for large discharge and large charge. Further, when an OCV curve is used, it is necessary to select one of the OCV curves.

There is a method of selecting the OCV curve to be used, by comparing a cumulative charge current amount with a cumulative discharge current amount (see Patent Document 1). As another method of estimating an OCV curve, there is a method of performing fitting and estimating a degradation state by expanding/contracting and shifting the discharge (charge) curves of the positive electrode and the negative electrode, and adding the result to a discharge (charge) curve history with respect to a small current (see Patent Document 2).

CITATION LIST

Patent Documents

Patent Document 1: Japanese Patent Application Laid-Open No. 2013-158087
Patent Document 2: Japanese Patent Application Laid-Open No. 2009-80093

SUMMARY OF THE INVENTION

Problems to be Solved by the Invention

In the case of the method disclosed in Patent Document 1, the shapes of OCV curves change as the battery degrades. Therefore, to accurately estimate SOC, it is necessary to update the OCV curves in accordance with the degradation. In the case of the method disclosed in Patent Document 2, OCV curves have hysteresis characteristics. Therefore, to estimate both OCV curves, it is necessary to obtain curve histories with respect to both discharge and charge. Even if one OCV curve is successfully estimated, the other OCV curve can be estimated only after a sufficient curve history is obtained. Also, even if the other OCV curve is successfully estimated, the OCV curves have different update timings from each other, and a time lag is generated. As a result, a difference in the degree of degradation appears between the OCV curves, and the SOC estimation accuracy becomes lower.

In view of the above, the object of the present disclosure is to provide a degradation state estimating device that can accurately estimate the other OCV curve from one OCV curve in a simple manner, a state-of-charge estimating device, an OCV curve calculating/generating device, and a power storage device

Solutions to Problems

To solve the above problems, the present disclosure provides a degradation state estimating device that includes: a Q calculator that receives inputs of the voltage, the current, and the battery temperature of a secondary battery, and calculates a discharge capacity; an OCV calculator that calculates an open-circuit voltage (OCV) value; and an OCV curve estimator that estimates at least one OCV curve.

The present disclosure provides a state-of-charge estimating device that includes an SOC estimator that estimates a state of charge (SOC) from the OCV curve and the open-circuit voltage (OCV) value estimated by the degradation state estimating device.

The present disclosure provides an OCV curve calculating/generating device that includes: an OCV curve calculator that receives inputs of the Q (discharge capacity) value and the open-circuit voltage (OCV) value of a secondary battery, and calculates a single OCV curve; and an OCV curve generator that generates at least one OCV curve from information defining the shape of the OCV curve estimated by the OCV curve calculator.

The present disclosure provides an OCV curve estimating device that includes: an OCV manager that receives inputs of the Q (discharge capacity) value and the open-circuit voltage (OCV) value of a secondary battery, and records discharge capacities and OCV values; an OCV curve controller that determines whether to start OCV curve estimation; the OCV curve calculating/generating device of claim 4; and an OCV curve manager that records and manages the generated OCV curve.

The present disclosure provides a power storage device that includes a secondary battery and a state-of-charge estimating device, wherein the state-of-charge estimating device includes: a Q calculator that receives inputs of the voltage, the current, and the battery temperature of the secondary battery, and calculates a discharge capacity; an OCV calculator that calculates an open-circuit voltage (OCV) value; an OCV curve estimator that estimates at least one OCV curve; and an SOC estimator that estimates a state of charge (SOC) from the OCV curve estimated by the OCV curve estimator and the open-circuit voltage (OCV) value.

Effects of the Invention

According to at least one embodiment, it is possible to accurately estimate an OCV curve with a low processing load. It should be noted that the effects to be achieved are not limited to the effect described above, and may include any of the effects described in the present disclosure.

BRIEF DESCRIPTION OF DRAWINGS

FIGS. 3A and 3B are schematic graphs for explaining changes in the shape of an OCV curve.

FIGS. 4A and 4B are schematic graphs for explaining the relationship between a discharge-side OCV curve and a charge-side OCV curve.

FIGS. 11A and 11B are schematic graphs for explaining a process of estimating the other OCV curve from one OCV curve in a first embodiment of the present disclosure.

FIG. 17 is a schematic diagram showing an example of the correlation table between the discharge-side OCV and the charge-side OCV.

MODES FOR CARRYING OUT THE INVENTION

The following is a description of embodiments of the present disclosure. It should be noted that the embodiments described below are preferred specific examples of the present disclosure, and technically-preferred restrictions are imposed on these embodiments. However, the scope of the present disclosure is not limited to these embodiments, unless a description is specifically made to limit the present disclosure.

The present disclosure will be explained in the following order.

<1. First Embodiment>
<2. Second Embodiment>
<3. Applications>
<4. Modifications>

1. First Embodiment

Figure 1:
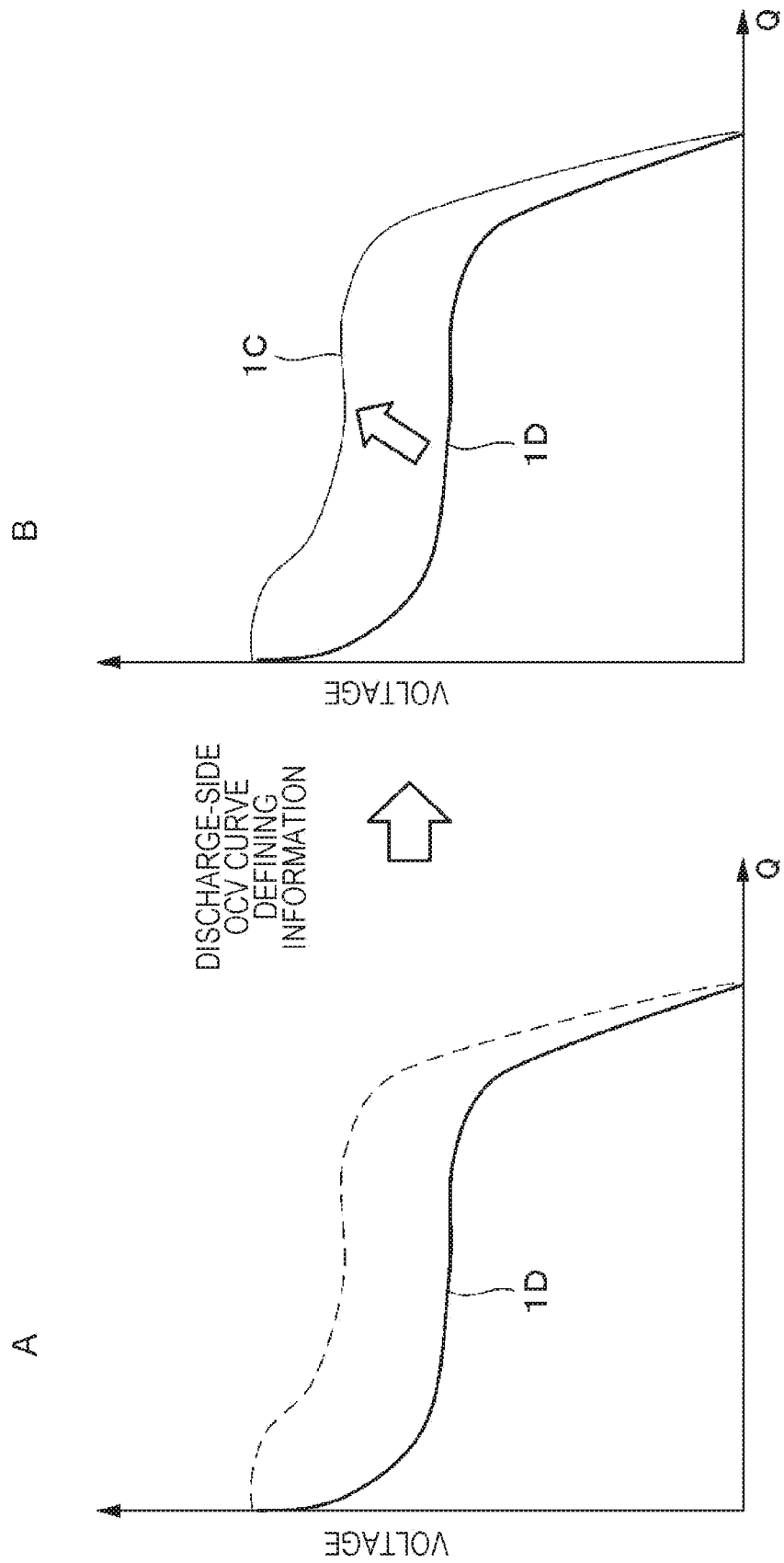
FIGS. 1A and 1B are schematic graphs for roughly explaining an open-circuit voltage estimating device according to the present disclosure.

The present disclosure is characterized in that the other OCV curve is accurately estimated from one OCV curve in a simple manner. FIGS. 1A and 1B are graphs for explaining the outline of the present disclosure. The abscissa axis indicates discharge capacity (Q), and the ordinate axis indicates voltage.

In a case where a discharge-side OCV curve 1D indicated by a solid line is known as shown in FIG. 1A, a charge-side OCV curve 1C can be estimated from the information defining the shape of the OCV curve 1D as shown in FIG. 1B. Meanwhile, the same applies in a case where the charge-side OCV curve 1C is known. The other OCV curve can be generated from one OCV curve in this manner, because the correlation between the OCV curves is very high. The inventors actually discovered such characteristics, and successfully confirmed that the relationship was maintained even when the battery degraded. It should be noted that a discharge-side curve is an OCV curve in a case where the proportion of discharge is larger than the proportion of charge, and a charge-side curve is an OCV curve in a case where the proportion of charge is larger than the proportion of discharge.

Figure 2:
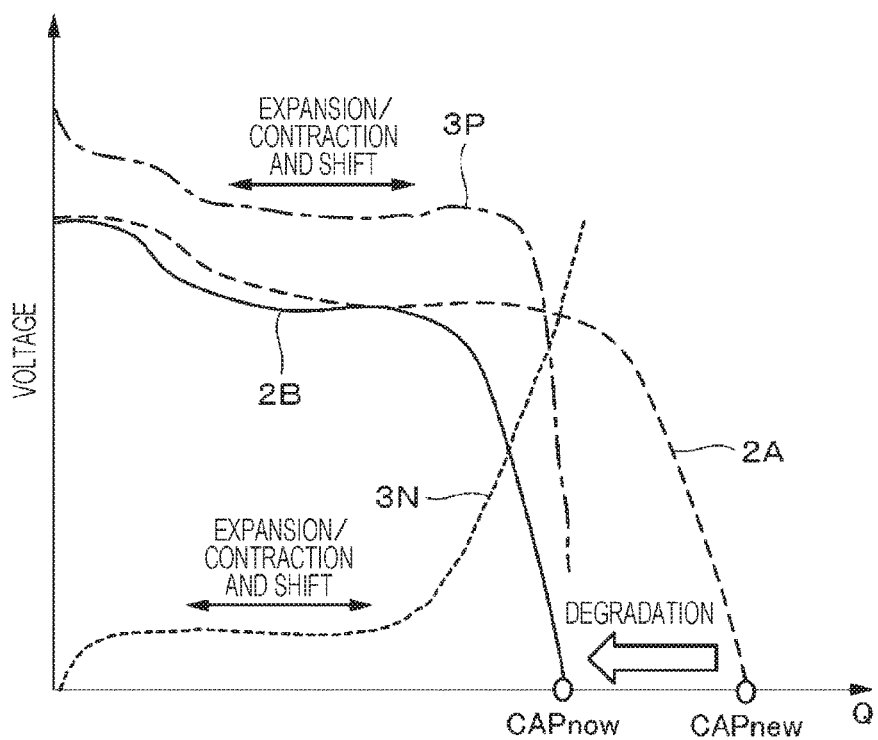
FIG. 2 is a schematic graph for explaining degraded OCV curves.

FIG. 2 shows a graph for explaining degraded OCV curves. When an OCV curve 2A (indicated by a dashed line) of an unused battery degrades, it turns into an OCV curve 2B (indicated by a solid line) having an expanded/contracted and shifted shape. It is known that the OCV curve of a battery can be expressed by a difference between the OCV curve 3P of the positive electrode and the OCV curve 3N of the negative electrode. The OCV curve 3P of the positive electrode and the OCV curve 3N of the negative electrode are normally measured by using a lithium metal as the opposite electrode. Therefore, a difference between the OCV curves of the respective single electrodes that have been obtained in advance and been expanded/contracted and shifted is calculated, to generate the OCV curve of the battery.

Referring now to FIGS. 3A and 3B, changes in shape of example OCV curves of a single negative electrode are described. As the capacity normally becomes smaller than an unused product, a battery becomes smaller in capacity as it degrades, and the shape of its OCV curve changes. As shown in FIG. 3A, the OCV curve 3Na of the negative electrode contracts as the battery capacity decreases. Further, the positional relationship between the OCV curves changes as the potential balance between the positive electrode and the negative electrode changes, and the OCV curves shift as shown in FIG. 3B. As a result of calculation of the difference between the OCV curves of the positive electrode and the negative electrode that have changed in shape as above, the OCV curve of the battery has a shape that has contracted and shifted compared with an unused battery. It should be noted that the capacity might become larger than an unused battery in some cases. In such a case, the change in shape is an expansion and a shift. Containing the meanings of both contraction and expansion, "expansion/contraction" is used.

A battery capacity can be estimated from the discharge capacity until the OCV curve of the battery reaches the cut-off voltage. FIGS. 4A and 4B show the relationship between the discharge-side OCV curve 1D and the charge-side OCV curve 1C. To check the relationship between the discharge-side OCV curve 1D and the charge-side OCV curve 1C, monitoring points (Ac, Ad, Bc, and Bd) shown in FIG. 4A were set near the inflection points of the OCV curves, and how the monitoring points change with capacity degradation of the battery was observed.

In FIG. 4B, the abscissa axis indicates the ratio (capacity maintenance rate) of the current battery capacity CAPnow to the initial battery capacity CAPnew, and the ordinate axis indicates the ratio DOD (Depth of Discharge) of the discharge capacity to the current battery capacity. The transitions of the monitoring points are drawn in FIG. 4B. It should be noted that SOC is considered to be the reciprocal of DOD in this specification. It was confirmed that the monitoring point relationship between discharge and charge did not change, though DOD changed with degradation. In this manner, the correlation between the discharge-side OCV curve and the charge-side OCV curve was found to be very high.

Figure 5:
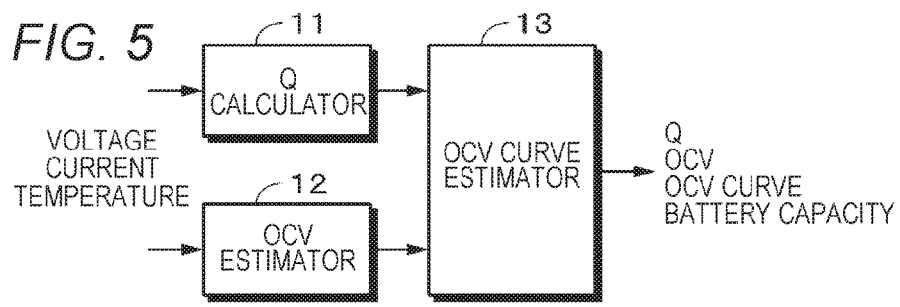
FIG. 5 is a block diagram of an example of a degradation state estimator.

FIG. 5 shows an example of a degradation state estimator. Information about voltage, current, and temperature is supplied from a secondary battery (not shown) to the degradation state estimator. The degradation state estimator includes a Q calculator 11, an OCV estimator 12, and an OCV curve estimator 13.

The Q calculator 11 calculates the discharge capacity (Q) since the time of full charge primarily from a cumulative current amount. The OCV estimator 12 calculates open-circuit voltage (OCV). If a time that is long enough to ignore concentration polarization in the battery has passed, the input measured voltage may be regarded as OCV as it is. With these calculated values serving as inputs, the OCV curve estimator 13 estimates the shape of the OCV curve. A battery capacity can be estimated from the discharge capacity until the OCV curve of the battery reaches the cut-off voltage.

Figure 6:
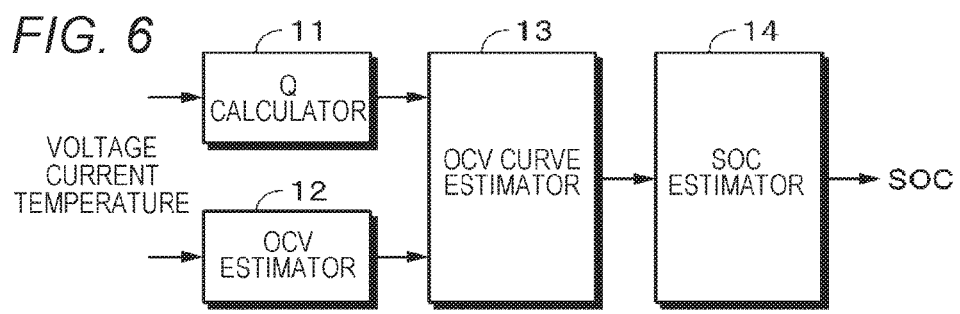
FIG. 6 is a block diagram of an example of a state-of-charge estimator.
Figure 7:
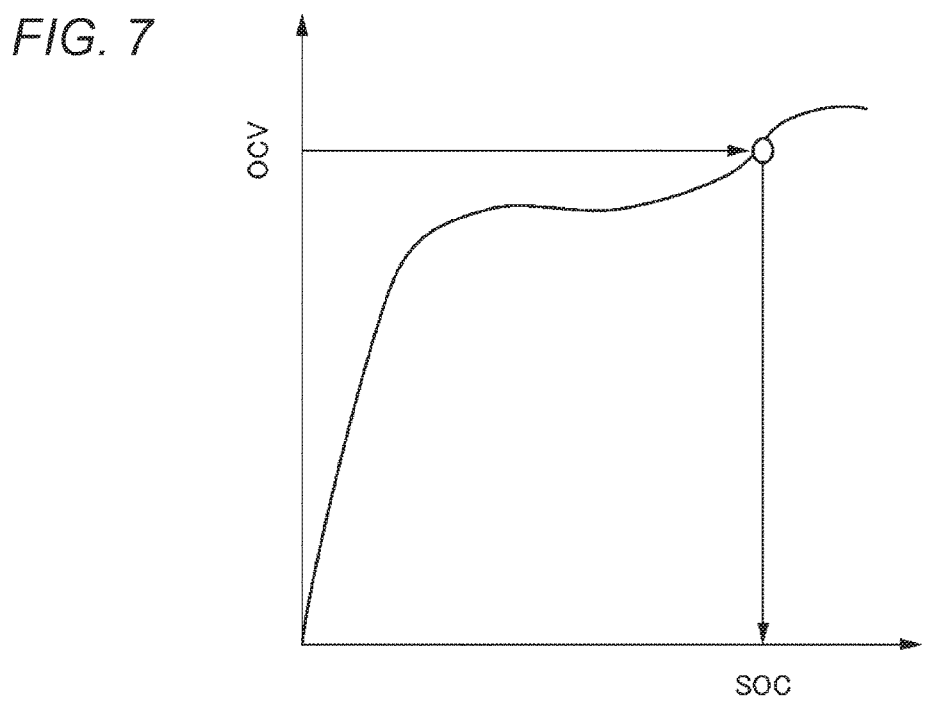
FIG. 7 is a schematic graph for explaining SOC estimation through OCV estimation.

FIG. 6 shows the configuration of a state-of-charge estimator. FIG. 7 is a graph for explaining SOC estimation through OCV estimation. As shown in FIG. 7, an SOC estimator 14 estimates SOC by referring to an estimated OCV value in the OCV curve estimated by the OCV curve estimator 13.

Figure 8:
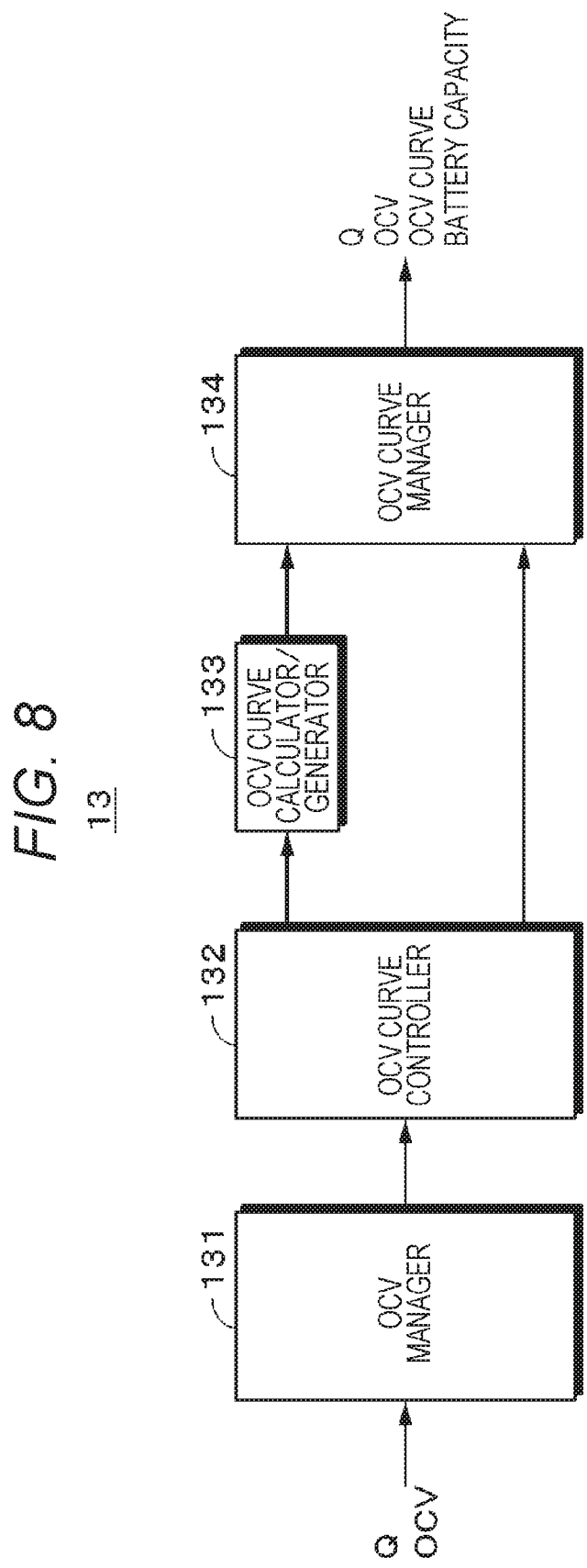
FIG. 8 is a block diagram of an example of an OCV curve estimator.
Figures 9, 10:
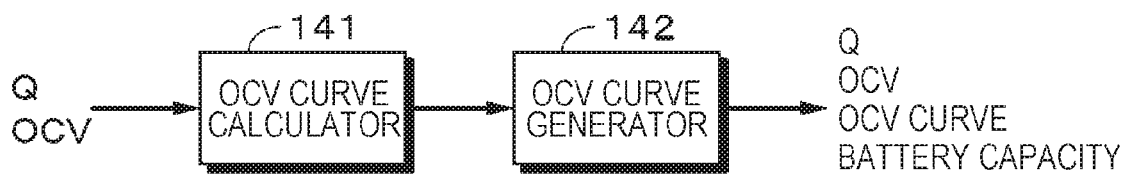
FIG. 9 is a block diagram of an example of an OCV curve calculator/generator.
FIG. 10 is a schematic diagram showing an example of recording of discharge capacities Q and estimated OCV values.

FIG. 8 shows an example configuration of the OCV curve estimator 13. The OCV curve estimator 13 includes an OCV manager 131, an OCV curve controller 132, an OCV curve calculator/generator 133, and an OCV curve manager 134. As shown in FIG. 9, the OCV curve calculator/generator 133 is formed with an OCV curve calculator 141 and an OCV curve generator 142 that are cascade-connected.

An estimated OCV value recording memory is provided, and the relationship between Q [mAh] and OCV [V] is recorded for each of the discharge side and the charge side, as shown in FIG. 10. For example, a charge-side OCV curve is estimated from a discharge-side OCV curve, as shown in FIG. 11. OCV curve estimation is performed through the process shown in the flowchart in FIG. 12. Further, OCV curve calculation is performed through the process shown in the flowchart in FIG. 13.

Step ST1: The OCV manager 131 of the OCV curve estimator 13 records capacities Q and estimated OCV values, to store an OCV value locus formed with estimated OCV values. The estimated OCV values are classified into the large discharge side and the large charge side before recording. Each white dot in FIG. 11A represents one sample of an estimated OCV value.

Step ST2: A check is made to determine whether the number of estimated OCV values has reached a sufficient value. The OCV curve controller 132 determines whether to start OCV curve estimation, depending on whether the OCV value locus on the discharge side or the charge side recorded in the memory has reached a sufficient amount to estimate an OCV curve.

Step ST3: If the number of estimated OCV values is determined to have reached a sufficient value, the OCV curve calculator/generator 133 estimates the shape of the OCV curve. That is, the shape of the OCV curve is estimated from the OCV value locus. If the number of estimated OCV values is determined not to have reached a sufficient value, the process returns to step ST1.

Step ST4: The other OCV curve (the charge-side OCV curve, for example) is generated from the information defining one OCV curve (the discharge-side OCV curve, for example).

Step ST5: The battery capacity is calculated from the OCV curve.

Step ST6: The OCV curve manager 134 records the OCV curve and the battery capacity into the memory or the like. The OCV curve estimation process then comes to an end.

FIGS. 11A and 11B are graphs for explaining estimation of the other OCV curve from one OCV curve. The discharge capacities and the estimated OCV values recorded in the memory or the like can be plotted, with the abscissa axis indicating discharge capacity Q and the ordinate axis indicating voltage. In this manner, an OCV value locus is drawn. Here, an example of an OCV value locus on the large discharge side is described.

While the OCV curve 3P of the positive electrode and the OCV curve 3N of the negative electrode on the discharge side obtained in advance are expanded/contracted and shifted with respect to this OCV value locus, fitting is performed on the generated OCV curve of the battery, to determine optimum fitting conditions. As a result, the information defining the discharge-side OCV curve, such as expansion/contraction rates and shift amounts, is obtained.

The OCV curve calculator/generator 133 generates the other OCV curve in accordance with the information (expansion/contraction rates and shift amounts) defining the one OCV curve. As shown in FIGS. 11A and 11B, the charge-side OCV curve can be generated by expanding/contracting and shifting the OCV curve of a single electrode on the charge side obtained in advance, using the information (expansion/contraction rates Xp and Xn, and shift amounts Yp and Yn) defining the discharge-side OCV curve.

In the example shown in FIGS. 11A and 11B, the charge-side OCV curve is generated with the use of the information defining the discharge-side OCV curve. At the same time as above (or in parallel with the above), a process of generating the discharge-side OCV curve is performed with the use of the information defining the charge-side OCV curve. Therefore, in the first embodiment of the present disclosure, there is no need to wait for the other-side OCV value locus to be satisfied, and there is no need to perform fitting with a high processing load. As the discharge-side OCV curve and the charge-side OCV curve are updated at the same time, any difference in the degree of degradation does not appear between the two OCV curves, and SOC estimation accuracy is not adversely affected.

Figure 12:
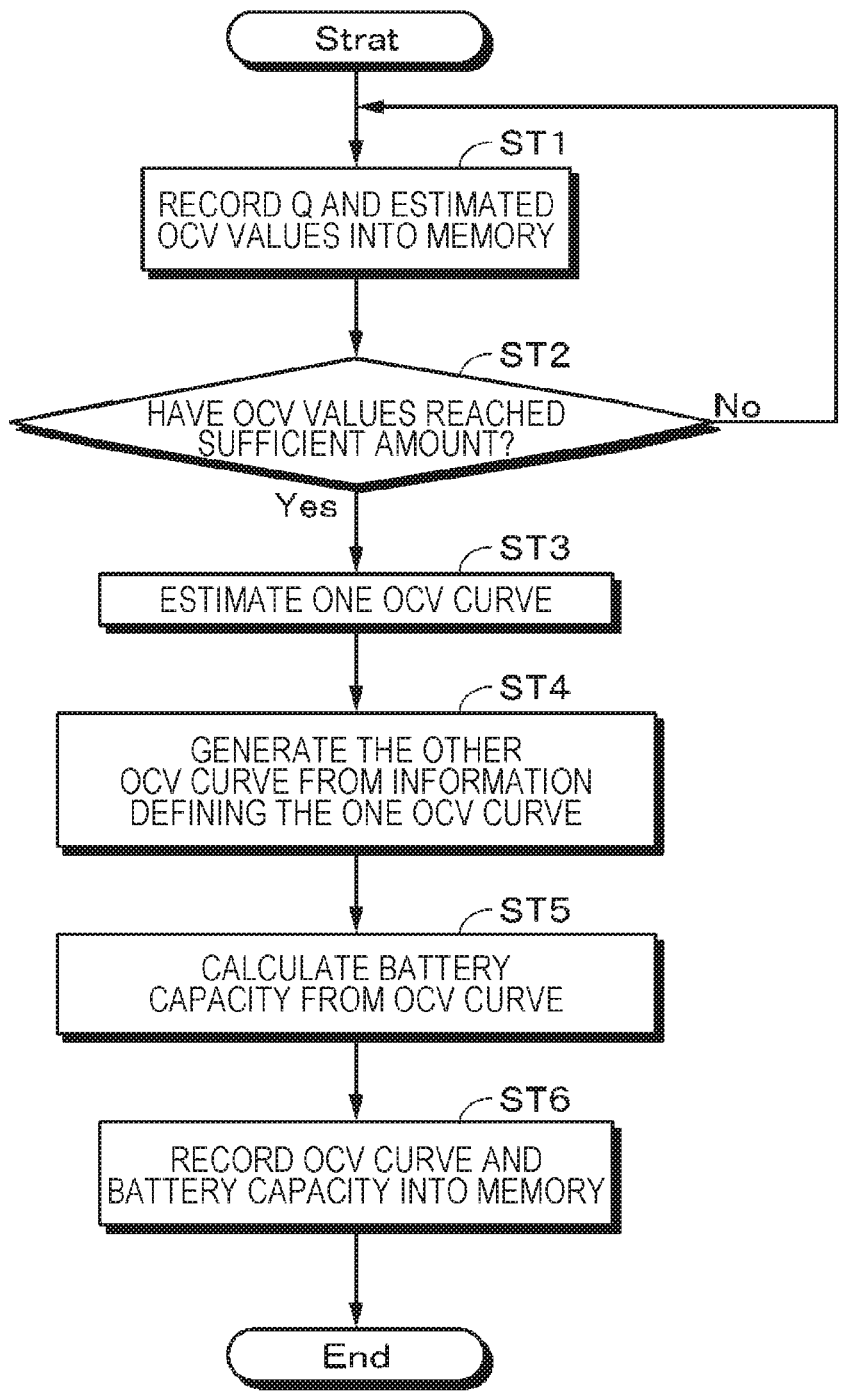
FIG. 12 is a flowchart showing the flow of an OCV curve estimation process.
Figure 13:
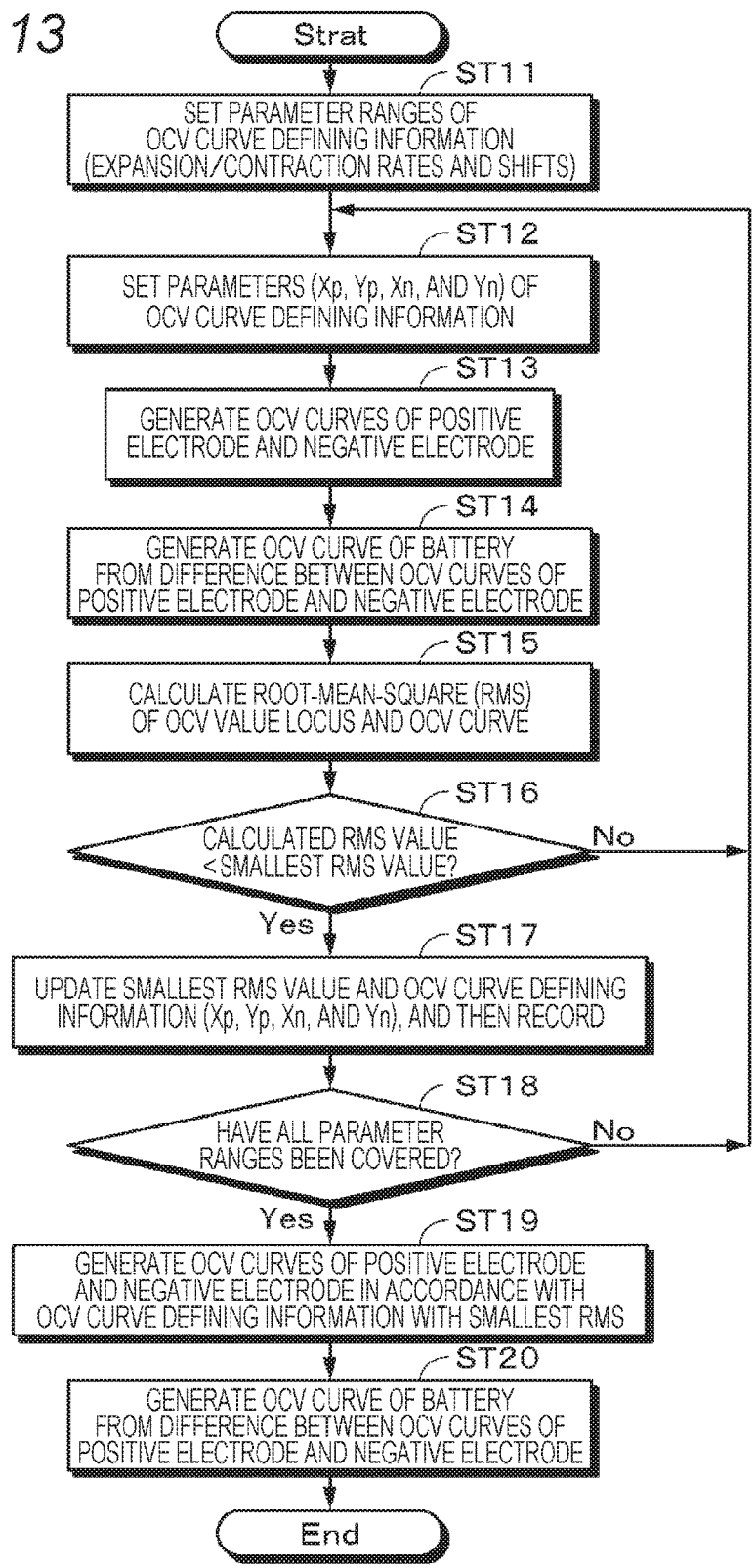
FIG. 13 is a flowchart showing the flow of an OCV curve calculation process.

Referring now to the flowchart in FIG. 13, the process of generating the other OCV curve from the information defining the one OCV curve (the process to be performed by the OCV curve estimator 13 in FIG. 8, or step ST4 in FIG. 12) is described in greater detail. However, the OCV curve calculation method is not limited to the one described herein. In the description below, a method of generating the OCV curve of a battery by expanding/contracting and shifting the OCV curve of a single electrode is described as an example.

Step ST11: First, the expansion/contraction rates (Xp and Xn) and the shift amounts (Yp and Yn) with respect to the OCV curve of the single electrode are used as parameters, and the value ranges within which the parameters are to be changed are set. For example, the expansion/contraction rates (Xp and Xn) are to be changed between 0.5 and 1.0 by 0.05 at a time.

Step ST12: The parameters of the information defining the OCV curves are set within the set ranges.

Step ST13: The OCV curves of the positive electrode and the negative electrode corresponding to the set parameters are generated.

Step ST14: The OCV curve of the battery is generated from the difference between the OCV curves of the positive electrode and the negative electrode.

Step ST15: The root-mean-square (called RMS) of the OCV value locus and the OCV curve is calculated.

Step ST16: The calculated RMS value is compared with the smallest value (the smallest RMS value) among the previously calculated RMS values. If the calculated RMS value is equal to or greater than the smallest RMS value, the process returns to step ST12 (setting the parameters (Xp, Yp, Xn, and Yn) of the OCV curve defining information).

Step ST17: If the result of the determination in step ST16 is positive, or if the calculated RMS value is smaller than the smallest RMS value, the smallest RMS value and the OCV curve defining information (Xp, Yp, Xn, and Yn) are updated and are then recorded.

Step ST18: A check is made to determine whether all the parameter ranges have been covered. If it is determined that not all the parameter ranges have been covered, the process returns to step ST12, and the above described procedures in steps ST12 through ST17 are carried out.

Through the above described process, an OCV curve under optimum conditions is calculated.

The OCV curves of the positive electrode and the negative electrode are generated. An example of generation of the OCV curve of the positive electrode is described. As for the OCV curve of the positive electrode obtained in advance, the discharge capacity at a certain point is set at $Q_{p0}(k)$. Where Xp represents the expansion/contraction rate, and Yp represents the shift amount (in the discharge capacity decreasing direction), the discharge capacity $Q_p(k)$ at this point can be expressed by the following equation:

$$Q_p(k)=Q_{p0}(k) \times X_p - Y_p \qquad \text{[Mathematical Formula 1]}$$

As the point position of the discharge capacity is changed in this manner, the shape of the OCV curve is controlled, and the OCV curve of the positive electrode is generated. As for the OCV curve of the negative electrode, the discharge capacity can also be expressed by the following equation:

$$Q_n(k)=Q_{n0}(k) \times X_n - Y_n \qquad \text{[Mathematical Formula 2]}$$

Figure 14:
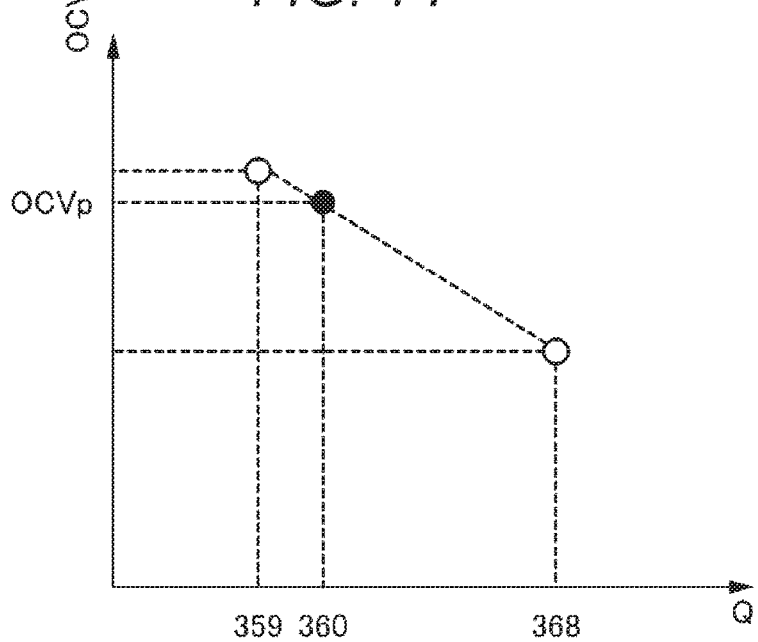
FIG. 14 is a schematic graph for explaining a process of calculating an OCV plot through linear interpolation.

To calculate the OCV curve of the battery, it is necessary to adjust the Q positions of the positive electrode and the negative electrode to each other before the difference between the OCV curves of the positive electrode and the negative electrode is calculated. FIG. 14 shows an example of calculation of an OCV plot through linear interpolation.

As shown in FIG. 14, where the expansion/contraction rate is 0.9, and the shift amount is 100 [mAh], the points of 510 [mAh] and 520 [mAh] move to the points of 359 [mAh] and 368 [mAh], respectively. In a case where the Q intervals are set at 10 [mAh], the OCV value at the point corresponding to 360 [mAh] is generated by a method such as linear interpolation.

The OCV curve of the battery is generated from the difference between the OCV curves of the positive electrode and the negative electrode. The OCV values of the positive electrode and the negative electrode with the discharge capacity $Q(k)$ at a certain point are $OCV_p(k)$ and $OCV_n(k)$, respectively.

The OCV(k), which is the OCV value of the battery with the discharge capacity $Q(k)$, can be expressed by the following equation:

$$OCV(k)=OCV_p(k)-OCV_n(k) \qquad \text{[Mathematical Formula 3]}$$

In preparation for fitting, the root-mean-square (RMS) of the OCV value locus and the generated OCV curve is calculated. RMS can be expressed by the equation shown below. A certain point on the OCV value locus is represented by $OCV_e(k)$. N represents the number of plots constituting the OCV curve. The parameters (expansion/contraction rates and shifts) with which this RMS value is minimized are recorded. As the parameters for obtaining the smallest RMS value are determined, an optimum OCV curve can be calculated.

$$\text{RMS} = \sqrt{\frac{\sum_{k=1}^{N}\{OCV_e(k)-OCV(k)\}^2}{N}} \qquad \text{[Mathematical Formula 4]}$$

In a case where fitting is performed in estimating an OCV curve, comparison needs to be performed every time values are changed within all the possible parameter ranges, and therefore, the processing load is high. Lithium iron phosphate (LiFePO$_4$), which is known as a battery positive-electrode material with a long service life and high security, is very difficult to degrade compared with a negative electrode.

Therefore, in a lithium-ion battery using this material as the positive electrode, only the parameters of the negative electrode can be changed while the parameters of the positive electrode are not changed at the time of fitting for OCV curve estimation. As a result, the processing load can be dramatically reduced.

Figure 15:
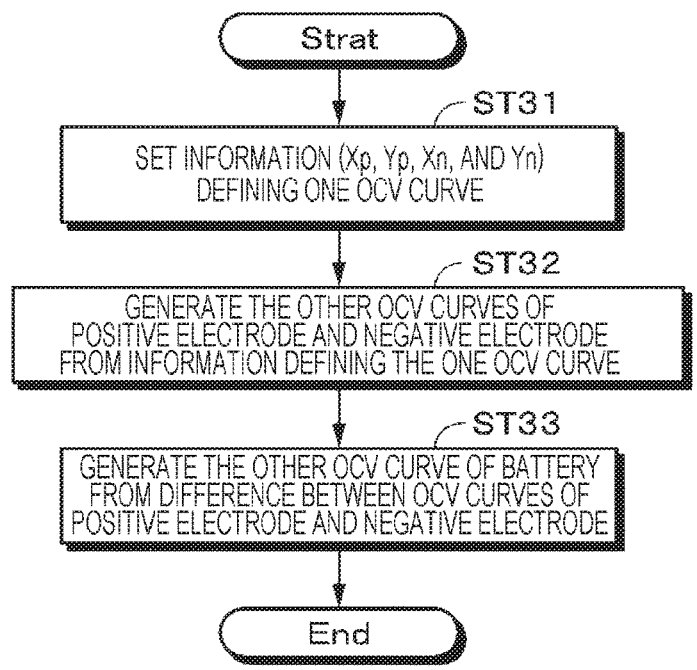
FIG. 15 is a flowchart showing the flow of an OCV curve generation process.

Referring now to the flowchart in FIG. 15, OCV curve generation is described.

Step ST31: The OCV curve defining information obtained in the course of calculation of one OCV curve generated by the OCV curve calculator 141 is supplied to the OCV curve generator 142.

Step ST32: The other OCV curves of the positive electrode and the negative electrode are generated with the use of this OCV curve defining information.

Step ST33: The other OCV curve of the battery is generated from the difference between the OCV curves of the positive electrode and the negative electrode. For example, if the discharge-side OCV curve has already been calculated by the OCV curve calculator 141, the charge-side OCV curve is calculated by the OCV curve generator 142. Note that it has been confirmed that the other OCV curve can be accurately generated from the information defining one OCV curve.

As described above, the OCV curve estimator of the present disclosure is used, so that the other OCV curve can be accurately estimated from one OCV curve in a simple manner. Both curves can be simultaneously estimated through estimation of only one curve.

Since OCV curves have hysteresis characteristics, it is necessary to estimate the discharge OCV curve and the charge OCV curve separately from each other by a conventional method. Therefore, there is a difference between the timings to update the respective OCV curves, and a time lag is generated. As a result, SOC estimation accuracy becomes lower. Such problems can be solved with the technology of the present disclosure.

Further, an OCV estimation method using an adaptive filter or the like is well known. By this method, however, the estimation accuracy is poor, or estimation is not possible, while a load change is small. Therefore, this method depends greatly on load changes. As a result, only the charge-side OCV curve or only the discharge-side OCV curve can be estimated in some cases. That is, by a conventional method, only one OCV curve can be estimated, or the frequency of updating the other OCV curve becomes very low. Such a problem can be solved with the technology of the present disclosure.

In a case where fitting is performed in estimating an OCV curve, comparison needs to be performed every time values are changed within all the possible parameter ranges, and therefore, an extremely high processing load is required. In the present disclosure, the processing load for calculating the other OCV curve from one OCV curve is very low, and the processing load and power consumption can be reduced.

Furthermore, both the OCV value locus on the discharge side and the OCV value locus on the charge side need to be recorded into the memory or the like. However, only one OCV value locus is recorded, and the need to record the other OCV value locus is eliminated. Accordingly, the memory usage can be reduced.

As described above, with a battery state estimating device of the present disclosure, the other OCV curve can be accurately estimated from one OCV curve in a simple manner. Thus, the state-of-charge (SOC) and the degradation state of a secondary battery can be accurately estimated.

2. Second Embodiment

Figure 16:
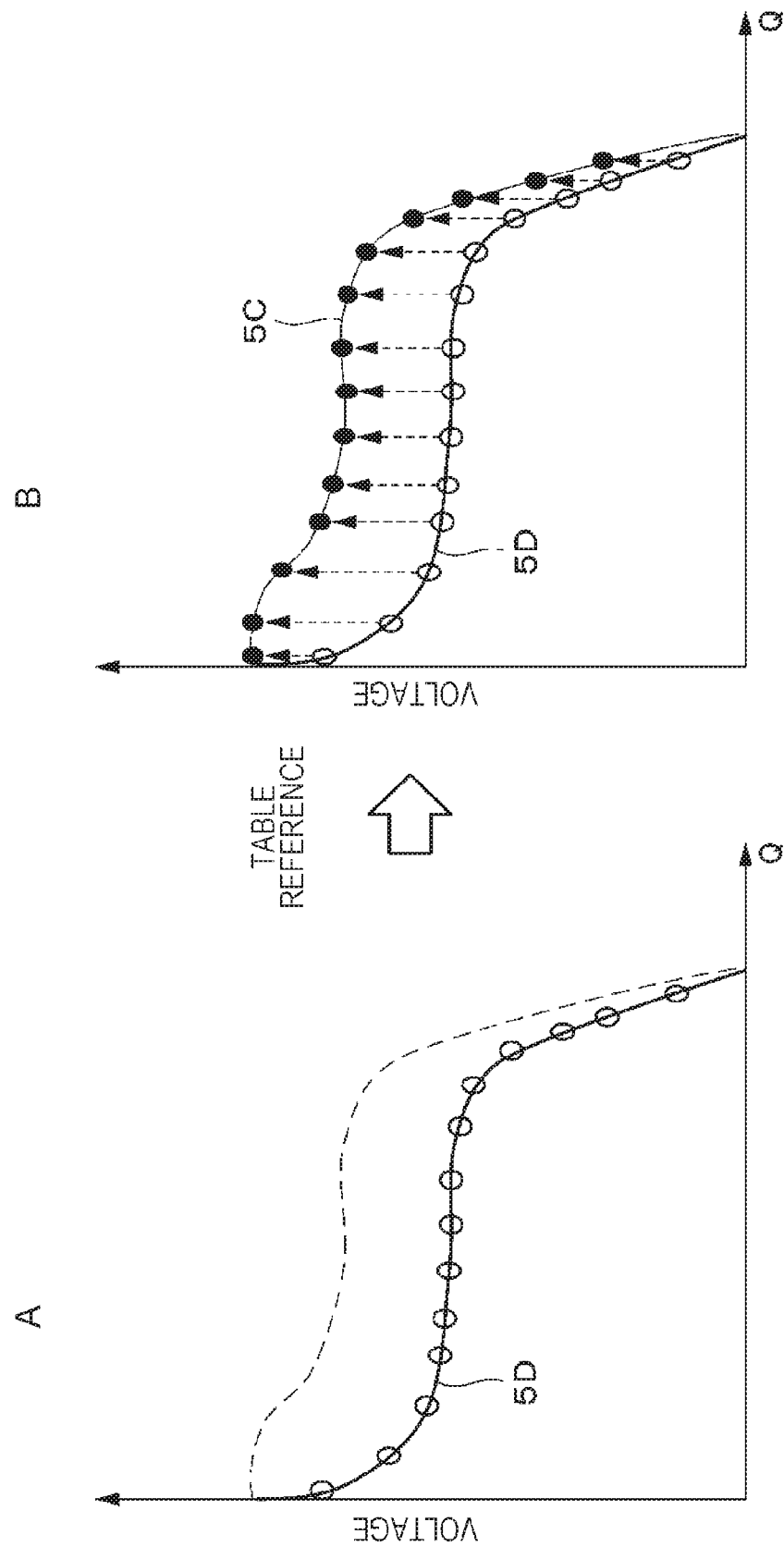
FIGS. 16A and 16B are schematic graphs for explaining a process of estimating the other OCV curve from one OCV curve in a second embodiment of the present disclosure.
Figure 18:
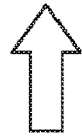
FIG. 18 is a schematic diagram for explaining a process of generating the charge-side OCV from the discharge-side OCV.

An OCV curve generator of a second embodiment is now described. FIGS. 16A and 16B are graphs for explaining a method of estimating the other OCV curve (the charge-side OCV curve, for example) from one known OCV curve (the discharge-side OCV curve, for example) by referring to a correlation table. FIG. 17 shows the correlation table between the discharge-side OCV and the charge-side OCV. As shown in an example in FIG. 18, the charge-side OCV is generated from the discharge-side OCV with reference to the correlation table.

The method of calculating the one OCV curve is not limited to any particular method. For example, only the discharge-side OCV curve is known. The charge-side OCV corresponding to the discharge-side OCV is calculated by referring to the correlation table. In this manner, when the one OCV curve is known, the other OCV curve can be generated by referring to the correlation table showing the relationship between the two OCV curves. The second embodiment achieves similar effects to those of the first embodiment.

3. Applications

Figure 19:
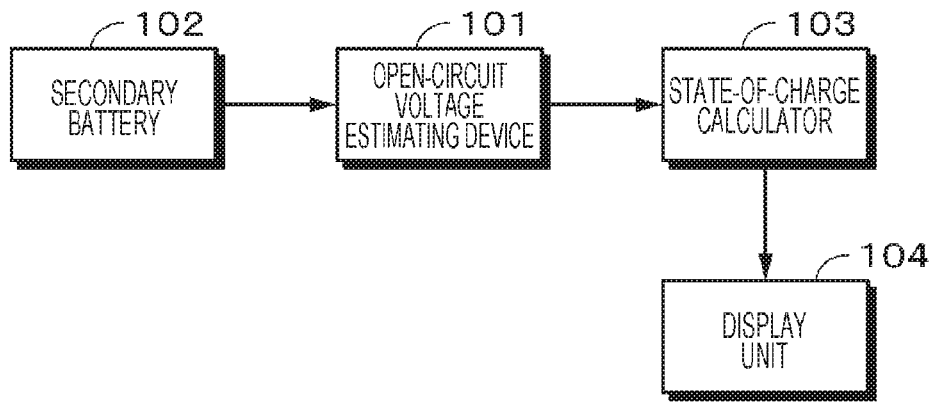
FIG. 19 is a block diagram showing an example configuration in a case where the present disclosure is applied to a power storage device.

As shown in FIG. 19, an open-circuit voltage estimating device 101 according to the present disclosure is used in a power storage device. Battery information (such as voltage, current, and temperature) from a secondary battery 102 is supplied to the open-circuit voltage estimating device 101. Although not shown in the drawing, a load (such as a motor) is connected to the secondary battery 102, and a charging circuit is connected to the secondary battery 102.

The open-circuit voltage estimating device 101 estimates an OCV curve as described above, and supplies the estimated OCV curve to a state-of-charge calculator 103. The state-of-charge calculator 103 calculates a state of charge (SOC). The information about the calculated state of charge is displayed on a display unit 104, for example, and is thus shown to the user.

Figure 20:
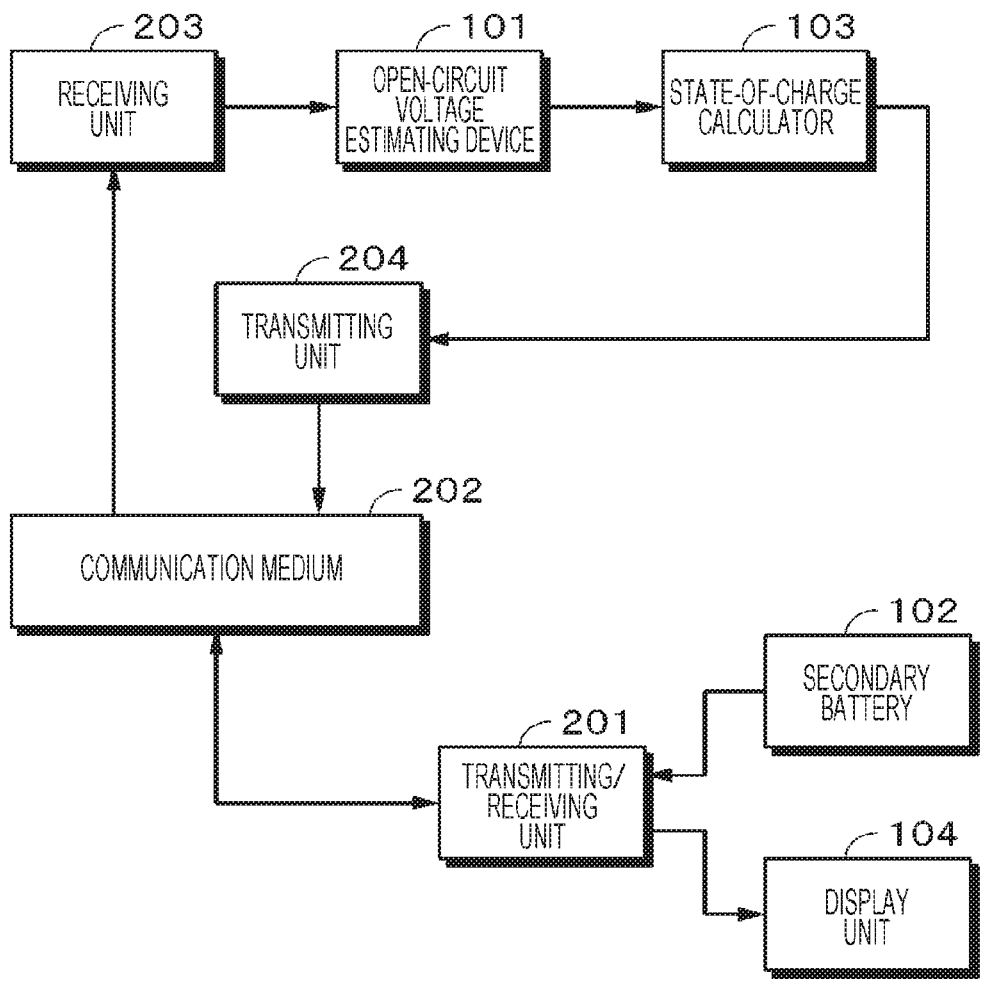
FIG. 20 is a block diagram showing another example configuration in a case where the present disclosure is applied to a power storage device.

FIG. 20 shows another example application. An open-circuit voltage estimating device 101 and a secondary battery 102 are installed at a distance from each other. Battery information from the secondary battery 102 is transmitted to a receiving unit 203 via a transmitting/receiving unit 201 and a communication medium 202. The communication medium 202 is a cable communication medium, a wireless communication medium, the Internet, or the like.

The battery information received by the receiving unit 203 is supplied to the open-circuit voltage estimating device 101, and an OCV curve is estimated as described above. The estimated OCV curve is supplied to a state-of-charge calculator 103, and a state of charge is calculated. The information about the state of charge is transmitted to the transmitting/receiving unit 201 through a transmitting unit 204 and the communication medium 202.

The state-of-charge information received by the transmitting/receiving unit 201 is displayed on a display unit 104, and is thus shown to the user. Although only one secondary battery 102 is shown in FIG. 20, a large number of terminal devices carrying secondary batteries are connected to the single open-circuit voltage estimating device 101 and the single state-of-charge calculator 103 via the communication medium 202. Accordingly, each terminal device does not need to perform any process with a relatively high processing load.

4. Modifications

Although embodiments of the present disclosure has been specifically described so far, the present disclosure is not limited to the above embodiments, and various changes based on the technical idea of the present disclosure can be made to it. For example, the configurations, the methods, the procedures, the shapes, the materials, the numerical values, and the like mentioned in the above described embodiments are merely examples, and configurations, methods, procedures, shapes, materials, numerical values, and the like that differ from those mentioned above may be used as necessary.

Although the two OCV curves on the discharge side and the charge side are used in the above described embodiments, the number of OCV curves is not limited to two. There are cases where two or more OCV curves are used depending on use conditions such as current and temperature, and the technology according to the present disclosure can also be applied in such cases.

It should be noted that the present disclosure may also be embodied in the configurations described below.

(1)
A degradation state estimating device including:
a Q calculator that receives inputs of the voltage, the current, and the battery temperature of a secondary battery, and calculates a discharge capacity;
an OCV calculator that calculates an open-circuit voltage (OCV) value; and
an OCV curve estimator that estimates at least one OCV curve.

(2)
The degradation state estimating device of (1), wherein the OCV curve estimator has a function to estimate a battery capacity.

(3)
A state-of-charge estimating device including
an SOC estimator that estimates a state of charge (SOC) from an OCV curve and an open-circuit voltage (OCV) value estimated by the degradation state estimating device of (1).

(4)
An OCV curve calculating/generating device including:
an OCV curve calculator that receives inputs of the Q (discharge capacity) value and the open-circuit voltage (OCV) value of a secondary battery, and calculates a single OCV curve; and
an OCV curve generator that generates at least one OCV curve from information defining the shape of the OCV curve estimated by the OCV curve calculator.

(5)
An OCV curve estimating device including:
an OCV manager that receives inputs of the Q (discharge capacity) value and the open-circuit voltage (OCV) value of a secondary battery, and records discharge capacities and OCV values;
an OCV curve controller that determines whether to start OCV curve estimation;
the OCV curve calculating/generating device of (4); and
an OCV curve manager that records and manages a generated OCV curve.

(6)
The OCV curve calculating/generating device of (4), wherein the OCV curve calculator calculates the OCV curve of the battery by calculating a difference and performing fitting while changing an expansion/contraction rate and a shift amount with respect to an electrode's OCV curve obtained in advance.

(7)
The OCV curve calculating/generating device of (4), wherein the OCV curve generator generates at least one OCV curve, using the expansion/contraction rate and the shift amount calculated by the OCV curve calculator of (6).

(8)
The OCV curve calculating/generating device of (4), wherein the OCV curve generator generates two or more OCV curves, using an OCV curve correlation table obtained in advance.

(9)
A power storage device including
a secondary battery and
a state-of-charge estimating device,
wherein the state-of-charge estimating device includes:
a Q calculator that receives inputs of the voltage, the current, and the battery temperature of the secondary battery, and calculates a discharge capacity;
an OCV calculator that calculates an open-circuit voltage (OCV) value;
an OCV curve estimator that estimates at least one OCV curve; and
an SOC estimator that estimates a state of charge (SOC) from the OCV curve estimated by the OCV curve estimator and the open-circuit voltage (OCV) value.

(10)
The power storage device of (9), wherein the secondary battery and the state-of-charge estimating device are disposed at a distance from each other, and are connected to each other via a communication medium.

REFERENCE SIGNS LIST

1D Discharge-side OCV curve
1C Charge-side OCV curve
11 Q calculator
12 OCV estimator
13 OCV curve estimator
101 Open-circuit voltage estimating device
102 Secondary battery
103 State-of-charge calculator
104 Display unit
202 Communication medium

The invention claimed is:
1. A degradation state estimating device, comprising:
a discharge capacity, Q, calculator configured to:
  receive, from a secondary battery, information regarding at least one of a voltage value of the secondary battery, a current value of the secondary battery, or a temperature value of the secondary battery, and
  calculate a Q value of the secondary battery based on the received information;
an open-circuit voltage, OCV, calculator configured to calculate an OCV value based on the voltage value; and
an OCV curve estimator configured to:
  obtain an OCV value locus, based on the calculated Q value and the calculated OCV value,
  determine a number of OCV values calculated by the OCV calculator, and estimate at least one OCV curve, based on the OCV value locus and the determined number of OCV values.

2. The degradation state estimating device according to claim 1, wherein the OCV curve estimator is further configured to estimate a battery capacity based on the estimated at least one OCV curve.

3. A state-of-charge estimating device, comprising:
a discharge capacity, Q, calculator configured to:
receive, from a secondary battery, information regarding at least one of a voltage value of the secondary battery, a current value of the secondary battery, or a temperature value of the secondary battery,
calculate a Q value of the secondary battery based on the received information;
an open-circuit voltage, OCV, calculator configured to calculate a first OCV value based on the voltage value;
an OCV curve estimator configured to:
obtain an OCV value locus, based on the calculated Q value and the calculated first OCV value,
determine a number of first OCV values calculated by the OCV calculator, and
estimate at least one OCV curve, based on the OCV value locus and the determined number of first OCV values; and
a state of charge, SOC, estimator configured to estimate a SOC, based on a second OCV value which is estimated from the at least one OCV curve.

4. An open-circuit voltage, OCV, curve calculating/generating device, comprising:
an OCV curve calculator configured to:
receive a discharge capacity, Q, value of a secondary battery and an OCV value of the secondary battery,
obtain an OCV value locus based on the received Q value and the received OCV value, and
estimate a shape of a first OCV curve, based on the OCV value locus and a number of OCV values, wherein the number of OCV values is determined based on the reception of the OCV value, and
an OCV curve generator configured to generate at least one second OCV curve based on information defining the estimated shape of the first OCV curve.

5. An open-circuit voltage, OCV, curve estimating device, comprising:
an OCV manager configured to:
receive a discharge capacity (Q) value of a secondary battery and an OCV value of the secondary battery, and
obtain an OCV value locus based on the received Q value and the received OCV value;
an OCV curve controller configured to determine a number of OCV values received by the OCV manager;
an OCV curve calculating/generating device configured to:
estimate a shape of a first OCV curve, based on the OCV value locus and the determined number of OCV values, and
generate at least one second OCV curve based on information defining the shape of the first OCV curve; and
an OCV curve manager configured to record and manage the generated at least one second OCV curve.

6. The OCV curve calculating/generating device according to claim 4,
wherein the OCV curve calculator is further configured to calculate an amount of at least one of an expansion/contraction or a shift of an electrode's OCV curve obtained in advance.

7. The OCV curve calculating/generating device according to claim 6, wherein the OCV curve generator is further configured to generate the at least one second OCV curve, based on the calculated amount of at least one of, the expansion/contraction or the shift of the electrode's OCV curve obtained in advance.

8. The OCV curve calculating/generating device according to claim 4, wherein the OCV curve generator is further configured to generate at least two OCV curves, using an OCV curve correlation table obtained in advance.

9. A power storage device, comprising:
a secondary battery, and
a state-of-charge estimating device,
wherein the state-of-charge estimating device includes:
a discharge capacity, Q, calculator configured to:
receive, from the secondary battery, information regarding at least one of a voltage value of the secondary battery, a current value of the secondary battery, or a battery temperature value of the secondary battery, and
calculate a Q value of the secondary battery based on the received information;
an open-circuit voltage, OCV, calculator configured to calculate a first OCV value based on the voltage value;
an OCV curve estimator configured to:
obtain an OCV value locus based on the calculated Q value and the calculated first OCV value,
determine a number of first OCV values calculated by the OCV calculator, and
estimate at least one OCV curve based on the OCV value locus and the determined number of first OCV values; and
an SOC estimator configured to estimate a state of charge, SOC, based on a second OCV value which is estimated from the estimated at least one OCV curve.

10. The power storage device according to claim 9, wherein the secondary battery and the state-of-charge estimating device are disposed at a first distance from each other, and the secondary battery and the state-of-charge estimating device are connected to each other via a communication medium.

* * * * *